United States Patent [19]
Crauwels

[11] Patent Number: 4,482,887
[45] Date of Patent: Nov. 13, 1984

[54] INTEGRATED WEIGHTED CURRENT DIGITAL TO ANALOG CONVERTER

[75] Inventor: Guy L. Crauwels, Fairfax, Va.

[73] Assignee: International Business Machines Corporation, Armonk, N.Y.

[21] Appl. No.: 492,973

[22] Filed: Jun. 1, 1983

Related U.S. Application Data

[63] Continuation of Ser. No. 12,276, Feb. 15, 1979, abandoned.

[51] Int. Cl.$^3$ ........................................... H03K 13/02
[52] U.S. Cl. ........................................... 340/347 DA
[58] Field of Search .............................. 340/347 DA

[56] References Cited

U.S. PATENT DOCUMENTS 3,217,147 11/1965 Chapman .................... 340/347 DA
3,747,088 7/1973 Pastoriza ..................... 340/347 DA

OTHER PUBLICATIONS

Maddox "Electronics" Apr. 4, 1974 pp. 125–130.

Primary Examiner—C. D. Miller
Attorney, Agent, or Firm—Robert J. Haase

[57] ABSTRACT

A weighted current digital to analog converter (DAC) translates digital bits to corresponding analog signals by a suitably operated transfer circuit of (1) multiple parallel current sources for more significant bits and (2) binary weighted current sources for lesser significant bits. The number of resistors and the ratio of adjacent resistors is reduced in the transfer circuit relative to a ladder type DAC. Power saving and linearity are improved by the reduced number and ratio of adjacent resistors. The transfer circuit facilitates fabrication of the DAC in a semiconductor. Temperature stability is improved by proper location of the current sources in the semiconductor.

6 Claims, 7 Drawing Figures

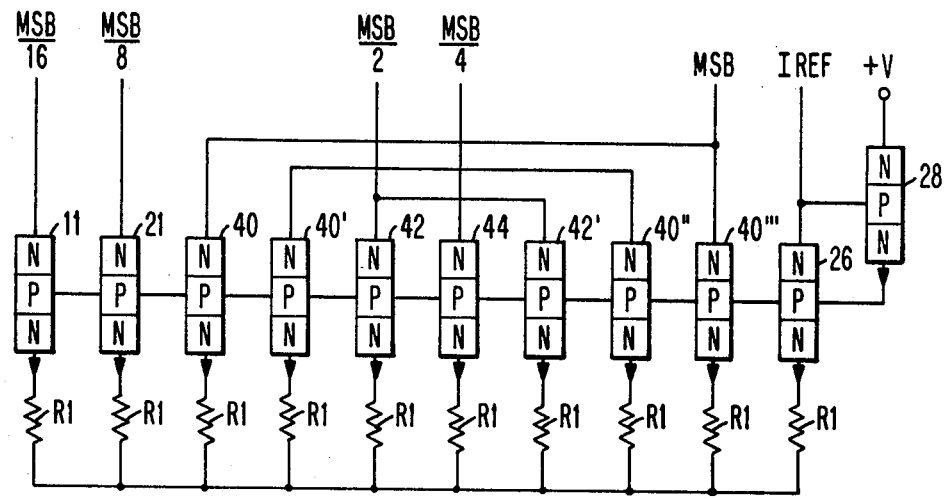
FIG. 4
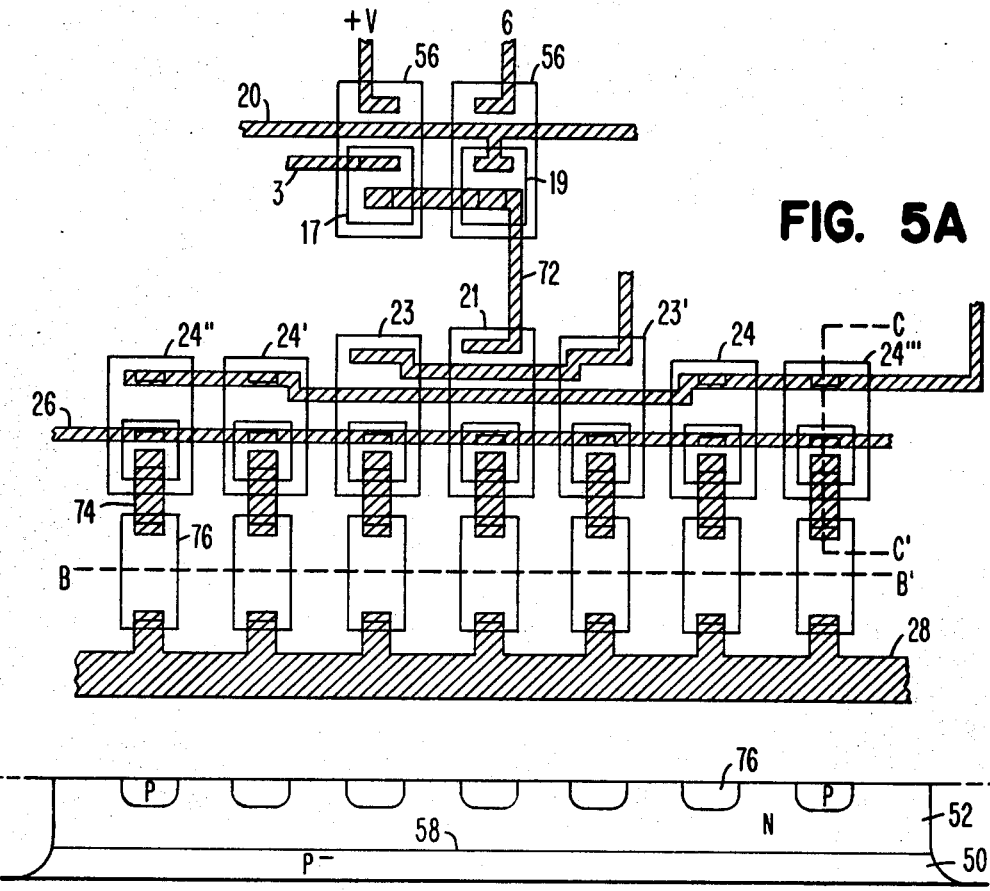
FIG. 5A
FIG. 5B
FIG. 5C

INTEGRATED WEIGHTED CURRENT DIGITAL TO ANALOG CONVERTER

This is a continuation of application Ser. No. 12,276 filed Feb. 15, 1979 now abandoned.

SUMMARY OF INVENTION

A. Field of Invention

This invention relates to signal converters, and more particularly to digital to analog convertors fabricated in semiconductor technology.

B. Description of Prior Art

Digital to analog convertors (DAC) comprise a digital input, a reference source and a transfer network. Typically, the transfer network may be a weighted resistor; resistor ladder; inverted ladder or weighted voltage network. The text "Electronic Analog/Digital Conversions" by H. Schmidt, published by Van Nostrand Reinhold Company, New York, 1970, Chapter 7, describes the organization and problems associated with a DAC. Converters, entirely fabricated in semiconductor technology, are further limited from a practical or commercial standpoint to a low order or relatively few digital bits, e.g., less than six. Presently, in transfer networks, resistor ratios, for the most significant bit (MSB) to the least significant bit (LSB) are of the order of 1:15, respectively. High resistor ratios are impractical for matching, tracking and total resistance in a transfer circuit for a weighted current DAC fabricated in large scale integrated semiconductor technology. The accuracy and linearity of converters are further diminished by the large tolerances associated with resistors fabricated in semiconductor material. Thermal instability also accompanies converters fabricated in semiconductor technology. Solution of the resistor problem for a weighted current DAC will permit (1) high order digital signals, e.g., more than six, to be translated into analog signals and (2) the benefits of large scale integrated technology to be achieved in signal converters.

A general object of the invention is a signal converter for translating high order digital signals to corresponding analog signals with improved linearity and temperature stability.

Another object is a digital to analog converter having a transfer circuit with a reduced number and ratio of adjacent resistors.

Another object is an integrated weighted current digital to analog converter that is amendable to fabrication in large scale integrated technology.

The number and ratio of adjacent resistors in a transfer circuit for a DAC may be reduced by a combination of multiple parallel current sources for low order or more significant bits and binary weighted current sources for high order or least significant bits. The lower resistor ratio improves the linearity of the DAC by better matching of the transistors and resistors in their respective current sources.

In an illustrative embodiment, a digital input signal $A_1 \ldots A_N$ is supplied in parallel to a signal converter having an output current $I_O = I_{REF}(A_1 + (A_2/2) + \ldots + (A_N/2^{N-1}))$ where $I_{REF}$ is a reference current, N is the number of digital signals being translated and $A_N$ is either zero (0) or (1) depending upon the absence or presence of a digital signal, respectively. The converter comprises a plurality of stages corresponding to the number of digital input signals. Logic switches in each stage are responsive to a digital signal in a bit position to connect or disconnect current sources to a summing network. Current sources for more significant or low order digital signals comprise a plurality of identical current sources that are multipled together to define a binary weighted value. Each current source is an active element, appropriately biased, and a matching resistor element connected together to provide a unit current, the combination of unit currents forming a binary weighted value corresponding to the digital signal. Current sources for less significant or high order digital signals comprise active elements, appropriately biased and matching resistors, connected together to provide a binary weighted current definitive of a discrete high order digital signal. The digital signals are decoded by the logic circuits and binary weighted currents are provided from the respective current sources to the summing network. The total current appearing at the summing network represents the analog conversion of each binary weighted bit in the digital signal.

A feature of the invention is multiple parallel current sources connected together to define low order bits of a digital signal.

Another feature is a combination of multiple parallel current sources and binary weighted current sources to define low order and high order significant bits, respectively, of a digital signal for conversion into a corresponding analog signal.

Another feature is a DAC with improved linearity by a transfer circuit that has matched transistors and resistors to compensate for voltage differences between adjacent transistors.

Another feature is a weighted current DAC fabricated in semiconductor technology and having a reduced number and ratio of adjacent resistors in a transfer circuit by the use of current sources in generating binary weighted currents corresponding to digital signals.

BRIEF DESCRIPTION OF THE DRAWINGS

These and other objects, features and advantages of the invention will be more fully apprehended from the following detailed specification taken in conjunction with the appended drawing in which:

FIG. 4 is an electrical schematic of another transfer network for the digital to analog converter of FIG. 2.

FIG. 5A is a plan view of a semiconductor incorporating the digital to analog converter of FIG. 2.

FIG. 5B is a cross sectional view of FIG. 5A along the line B—B'.

FIG. 5C is a cross sectional view of FIG. 5A along the line C—C'.

DETAILED DESCRIPTION OF PREFERRED EMBODIMENT

Figure 1:
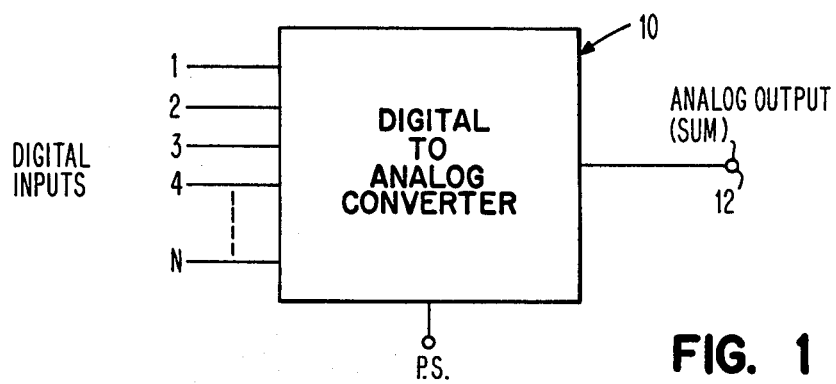
FIG. 1 is a block diagram of a digital to analog converter responsive to a digital signal, in parallel form, to provide an analog output signal representative of the digital input.

In FIG. 1, a plurality of digital signals 1 . . . N are provided as a parallel input to a signal converter 10. The digital signals are defined by the presence of a signal designated as a 0 or plus (+) voltage or the absence of a signal designated by a 1 or minus (−) voltage. This is called inverted logic. For the purpose of the present description, a four bit digital input signal will be assumed as the input to a four stage converter. It should be understood, however, the invention is not limited by the number of digital signals or stages. In fact, the invention is adapted to handle high order digital signals, i.e., more than six bits.

The digital signal appearing on line 1 is designated as the most significant bit (MSB) and the digital signal appearing on line 4 is designated as the least significant bit (LSB). The converter 10 accepts the sequence of pulses or bit pattern to control a source (P.S.) to provide an output signal at a terminal 12 which is the analog or sum of the digital pattern on the lines 1 through 4.

Figure 2:
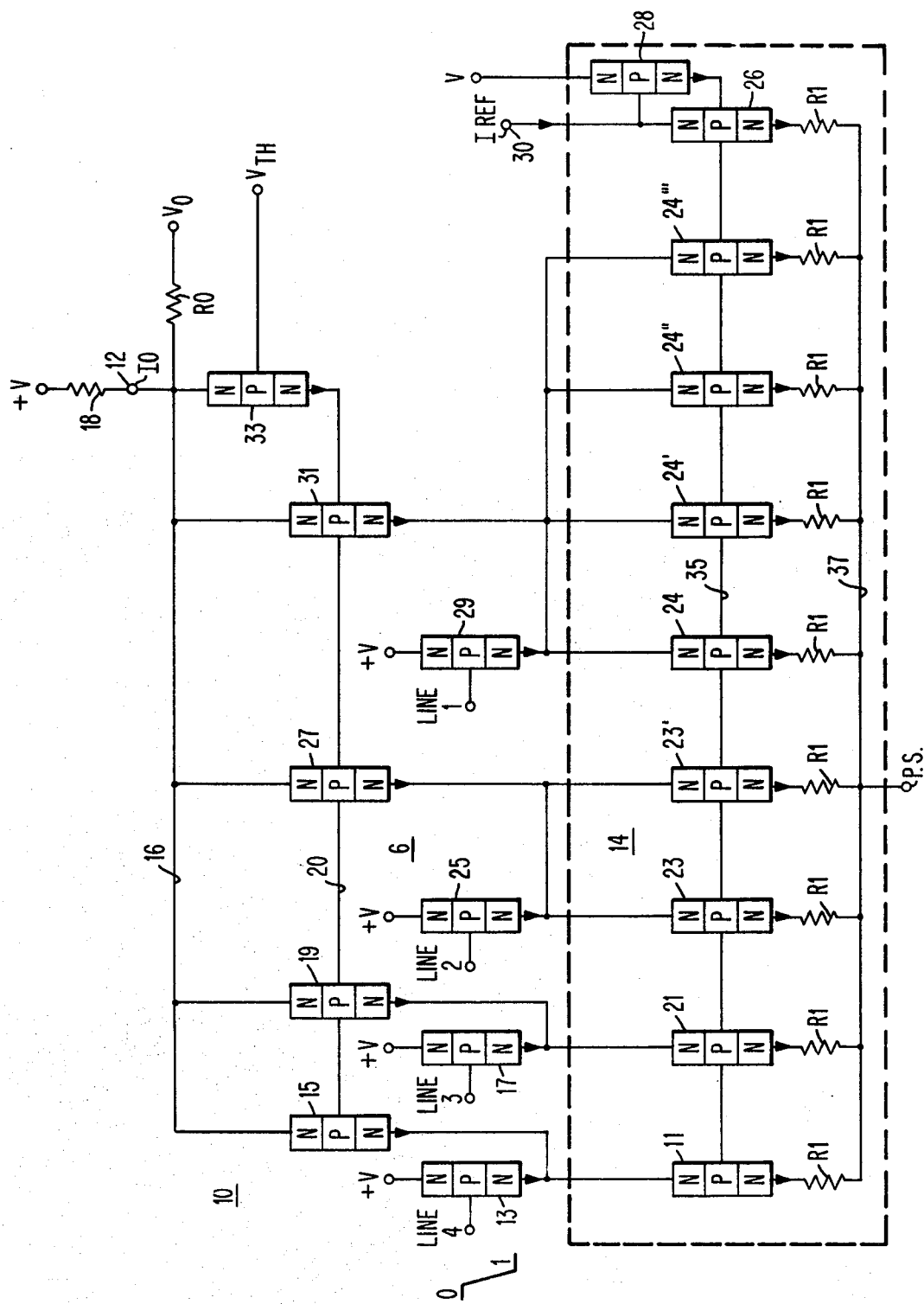
FIG. 2 is an electrical schematic of a digital to analog converter that practices the principles of the present invention.

FIG. 2 shows a four (4) stage converter 10, in one form, comprising a transfer network 14 and a logic network 16. The lines 1–4 are connected as input to the logic network 16 which controls the transfer network 14. A plurality of current sources comprise the transfer network, one or more current sources being associated with each input line. The current sources for the high order bits (lines 3,4) are binary weighted resistor sources. The current sources for the low order bits (lines 1,2) are multiple parallel current sources of the same binary weight.

The logic section 16 comprises a current switch for each input line. When a digital signal is present on a line, current flows through one side of the switch to the transfer network 14. When a signal is not present on the line, current flows through a summing line 16 and the other side of the switch to the current source. The total current flowing in a transfer network 14 appears on the line 16 and at the output terminal 12.

The current source at each stage comprises a high impedance element, typically a transistor 11, 21, 23, 23', 24, ... 24''' including a reversed biased junction and a resistor of appropriate magnitude. A reference current $I_{REF}$ is generated for the transfer network by a transistor 26 and a resistor R1. A transistor 28 is connected to an appropriate supply voltage to forward bias the transistor 26. The transistors 11 ... 24''' are forward biased by line 26 connecting the respective base electrodes to the bias device 28.

The current sources for the least significant bit include resistors which have a ratio of 2:1 for adjacent stages. The resistor for the lowest order least significant bit has a magnitude of R1. The resistor for the adjacent or next higher order least significant digit has a magnitude of 2R1, 4R1 ... $2^{N-1}$ where N is the low order stage.

The current supply for the more significant bits is obtained by multiplying identical current sources. The current source for line 2, which has a binary weighted value twice that of line 3, comprises current sources 23, 23' and their associated resistors R1. Similarly, the current source for line 1, which has a binary value quadruple that of line 3, comprises four current sources 24, 24', 24'', and 24''' and their respective resistors R1. The transfer network 14, therefore, provides binary weighted currents corresponding to digital values $2^1$, $2^2$, $2^4$ and $2^8$ for input lines 4, 3, 2 and 1, respectively.

The voltage drop across the emitter base junction of the transistor 26 and the associated resistor R1 forward biases the transistors 11, 21, 23, 23', 24, 24', 24'' and 24''' in a normally conducting condition at the current value corresponding to the $I_{REF}$ is input to transistor 26.

In one form, the logic circuit associated with each stage and/or input line is a current switch. In stage 4, a transistor 13 and a transistor 15 are coupled together at one end to the current source 11. A second end of the current switch is connected to the input line into a supply voltage of appropriate polarity and magnitude. A third end of the current switch is connected to the summing line 16. Normally, the signal level on the line 4 places the transistor 13 in a conducting condition and the transistor 15 in a non-conducting condition. This state of the current switch represents a binary zero condition. An appropriate signal on the line 13 places the transistor 13 in a non-conducting condition and the transistor 15 in a conducting condition. This condition of the current switch is a binary 1 condition. A voltage supply V+ is connected to an appropriate resistor 18 and the line 16 to function as a current supply for the current source 11. A transistor 33 also connected to the resistor 18 provides base current to a line 20 to place the transistor 15 in a conducting condition when the transistor 13 is non-conducting. The transistor 33 is appropriately biased by $V_{TH}$ which sets the required input line signal levels.

The current switches comprising transistors 17 and 19 for line 3, transistors 25 and 27 for line 2 and transistors 29 and 31 for line 4 operate in a manner identical to that described for the current switch for line 4. The sum of the currents flowing through the transistors 15, 19, 27 and 31 appears on line 16 and is the analog of the digital input signal appearing on the lines 1, 2, 3 and 4. The current sum also appears at the terminal 12 or may be translated to a voltage VO by taking an output across a resistor $R_o$.

In the transfer network 14, current flow through the binary weighted resistors associated with lines 3 and 4 will be in a 2 to 1 ratio, respectively, only if the same potential exists across adjacent resistors. It can be shown that two physically identical transistors operating at different emitter currents having a fixed ratio of 2 to 1 will exhibit a finite difference in their respective base to emitter voltages. The difference (S) can be shown to be as follows:

$$S = (KT/q) \ln 2 \qquad (1)$$

$S = 18$ millivolts

The voltage difference S or 18 millivolts between adjacent stages can be offset by increasing the magnitude of the larger binary weighted resistor in an adjacent pair. It can be shown that the following relation defines each binary weighted resistor in the network 14 whereby the voltage across the resistors is the same and the currents are in a correct binary relation:

$$R_n = 2^{(n-1)} R_1 + (n-1)(S/I_1) \qquad (2)$$

where
  n is an integer corresponding to the binary digit represented by the resistor
  $R_1$ is a resistor magnitude selected for the most significant bit of the network
  $I_1$ is the current flow through the resistor $R_1$ Based upon formula 2 and selecting $R_1$ to have a magnitude of 1000 ohms, the resistor $2R_1$ in FIG. 2 can be shown to have a magnitude of 2036 ohms for a current $I_1$ of 1 milliamp. The resistors for additional current sources in the network 14 can be calculated in a similar manner. Compensating for the voltage differences between adjacent binary weighted stages increases the linearity of the DAC.

Figure 3:
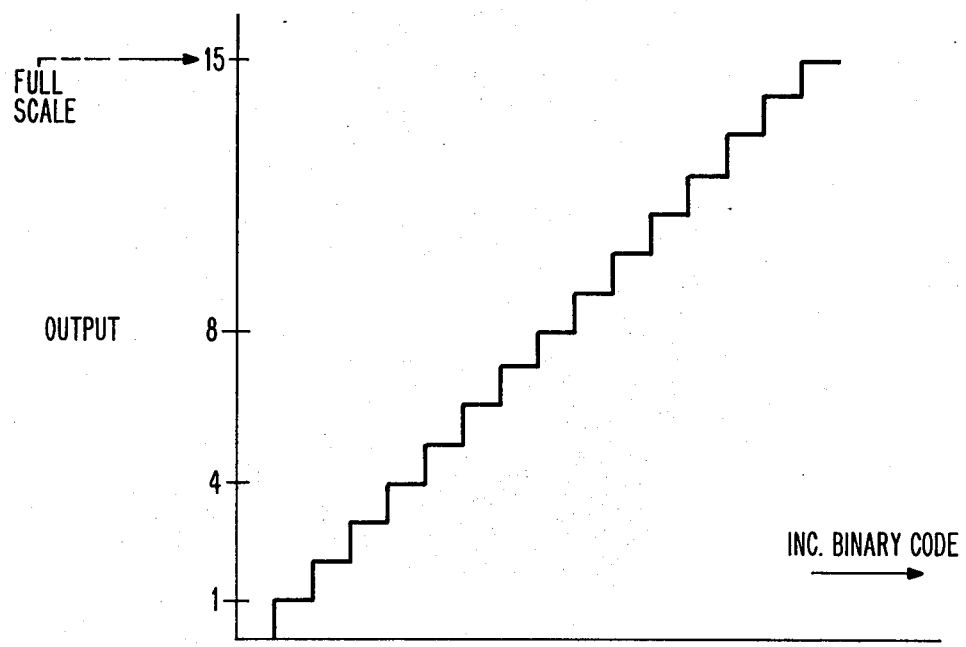
FIG. 3 is a graph of output voltage versus digital input signals for the digital to analog converter of FIG. 2.

FIG. 3 shows the output currents in units appearing at the terminal 12 in FIG. 1 or FIG. 2 for the respective pulse patterns appearing on the lines 1, 2, 3 and 4. A sequence of all binary zeros "(0's)" generates no output current in the sum line. A pulse pattern where the least significant bit is a binary "(1)" and all other inputs are a binary "(0)" generates an output current of one unit by reason of the current flow through transistor 15 to the current source 11 and the current flow to the base electrodes of the transistor 15. A pulse pattern where the most significant digit is a binary "(1)" and all other signals are a binary "(0)" generates an output of eight units by reason of the current flow through transistor 31 to the current sources 24, 24', 24'', 24''' and the current flow to the base electrodes of the transistor 31. A pulse pattern where all signals are a binary (1) generates an output of fifteen units based upon the sum of 8, 4, 2 and 1 unit of current flowing in the respective current sources. In like manner, it can be shown that the current units in FIG. 3 for the respective pulse pattern can be obtained by the DAC of FIG. 2 as the various pulse patterns are presented on the lines 1-4.

In FIG. 4, a transfer network 14 has the current sources reordered relative to FIG. 2 to correct for thermal gradient across a semiconductor device incorporating the network. It can be shown that the thermal gradient across a semiconductor substrate can be normalized by equally dividing the current in high order stages about the current sources of the next lower stage. Thus, in FIG. 4, current sources 40, 40', 40'' and 40''' for the most significant bit are equally disposed on opposite sides of the current sources 42 and 42' for the next least bit. Similarly, the current sources 42 and 42' are equally disposed on opposite sides of the current source 44 for the second most significant bit. Balancing the current flows for the high valued current sources in the manner described overcomes the problems of thermal gradient and improves thermal stability of the DAC.

The DAC is amenable to manufacture in large scale integrated technology by (1) the reduction of the resistor ratio from the most significant bit to the least significant bit, (2) the reduction in the number of resistors by the use of current sources in the transfer network in lieu of a resistor ladder network, (3) the improvement in DAC linearity by the lower resistor tolerance associated with the reduced resistor magnitude and (4) the improved thermal stability of the DAC by the location and order of the current sources in the transfer network. Also, the ratio of adjacent resistors may be adjusted to overcome the $V_{BE}$ differences in adjacent transistors. The elimination of $V_{BE}$ differences achieves better matching of transistor operating points with resultant improved linearity for the DAC. The linearity can be further improved by compressing the emitter currents of the transistors to operate in their respective linear ranges. In FIGS. 5A, 5B and 5C, a P− substrate 50 of 15 ohms centimeter is suitably prepared to receive an n epitaxial layer 52 of 1.5 ohms centimeter. P+ isolation regions are formed about the respective current switch elements and current sources elements associated with each digital input line. A junction 58 between the substrate 50 and the layer 52 completes the isolation of the respective current switch and current source elements from one another. A subcollector 60, as shown in FIG. 5C, is included in the isolation pocket 62 associated with respective current switch or current source element. The subcollector reduces the collector resistance and improves switching performance, as is well known in the semiconductor art. A base diffusion 64 of p type conductivity is formed in the respective isolation pockets. An emitter region 66 and collector contact region 68, of N+ type conductivity, as shown in FIG. 5C, are formed in the isolation pocket 62 to complete the active element. An insulating layer 70 formed on the surface of the epitaxial layer serves as a passivating surface for the respective active element. The layer 70 supports metallization which interconnects the current source and current switch element as well as providing the connection to the power supply and input/output terminals.

In FIG. 5A, digital input line 3 is shown connected to the respective current switch elements. A single isolation pocket 56 is employed for each current switch where the collector terminals of the switching transistors 17, 19 and the like, are operated at different potentials. The current summing line 16 is connected to the respective transistors of each current switch. An appropriate connection is made from each current switch to the voltage supply V+. The common base line 20 is extended to the respective current switch elements and a connection 72 is completed from the current switch element to the associated current source.

Each current source element is fabricated in a manner similar to that described for the current switch element. The common base line 26 interconnects the base loads of the various current sources. A connection 74 is formed from each current source to the associated resistor element R1. P type diffused regions 76, shown in FIG. 5B, are formed as resistors in the layer 52 at the time the base elements 64 are formed. A common connection 28 is made to each resistor to permit connection to a current sink (not shown) to complete the electrical circuit for the DAC.

While the DAC has been shown fabricated with NPN transistor elements, it should be understood that PNP type devices may be substituted, provided the appropriate changes are made in source/sink polarity. Also, the logic circuit 16 may utilize transistor-transistor logic (TTL), direct coupled transistor logic (DCTL) and other well known logic circuits as a substitute for the current switch logic, shown and described in FIG. 2.

While the invention has been particularly shown to describe with reference to preferred embodiments thereof, it will be understood by those skilled in the art that the foregoing and other changes in form and detail may be made therein without departing from the spirit and the scope of the invention.

What is claimed is:

1. An integrated digital to analog converter device comprising:
   a. a semiconductor member,
   b. signal input lines formed on the member for receiving a plurality of digital input signals,
   c. a plurality of logic circuits formed in the member, each logic circuit connected to a digital input signal line,
   d. a plurality of binary weighted current sources and a plurality of groups of current sources for generating discrete binary weighted currents of different magnitudes, each group of current sources being exclusively associated with a separate binary value, each current source including a passive element formed in the member and controlled by the logic circuits, the passive elements of the binary weighted current sources being of different magnitudes while those of the groups of current sources have the same magnitude, e. a summing circuit formed in the member for receiving currents from the binary weighted and the groups of current sources, the current sum being definitive of the digital input signal, and f. means for connecting each logic circuit to the summing circuit and a different current source.

2. A signal converter comprising:

a. logic circuits responsive to a plurality of digital input signals, b. a transfer circuit responsive to the logic circuits and comprising at least one binary weighted current source and a plurality of groups of current sources for generating discrete binary weighted currents of different magnitudes, the binary weighted current sources including passive elements of different magnitudes for separate binary values while each current source of each group of current sources includes a passive element of the same magnitude which is equal to one half the magnitude of the smallest passive element of said at least one binary weighted current source and each group of current sources is exclusively associated with a separate binary value, c. means connected to the logic circuits for summing the weighted currents from the transfer circuit corresponding to the binary weight of the digital input signals to the logic circuit, and d. means for directly connecting each current switch logic circuit to the summing circuit and a different current source.

3. A signal converter embedded in a semiconductor chip comprising:

a. a transfer circuit comprising
   (i) at least one binary weighted current source including a transistor and a resistive element of a discrete binary weight, and
   (ii) groups of identical current sources each having a different binary weight, each current source of each group of current sources comprising a transistor and a resistor, the magnitude of the resistor being the same for each group and being equal to one half the magnitude of the smallest resistive element of said at least one binary weighted current source, b. a plurality of logic circuits, each logic circuit having a first, second and third terminal, c. a summing circuit, d. means for connecting the first terminal of each logic circuit to the summing circuit, e. means for directly connecting each second terminal to a selected current source of one binary weight, and f. means for supplying digital input signals to the third terminal of each logic circuit for directly connecting the current sources to the summing circuit to convert the digital input signal to a corresponding analog signal.

4. A signal converter circuit of claim 3 wherein each logic circuit is connected to a single current source definitive of a discrete binary weight.

5. The signal converter circuit of claim 4 wherein each group of identical current sources is directly connected to the summing circuit through a single logic circuit.

6. The signal converter circuit of claim 5 wherein each logic circuit is between the associated current source and the summing circuit.

* * * * *